(12) United States Patent
Swift et al.

(10) Patent No.: US 7,679,125 B2
(45) Date of Patent: Mar. 16, 2010

(54) BACK-GATED SEMICONDUCTOR DEVICE WITH A STORAGE LAYER AND METHODS FOR FORMING THEREOF

(75) Inventors: Craig T. Swift, Austin, TX (US); Gowrishankar L. Chindalore, Austin, TX (US); Thuy B. Dao, Austin, TX (US); Michael A. Sadd, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 962 days.

(21) Appl. No.: 11/300,077

(22) Filed: Dec. 14, 2005

(65) Prior Publication Data
US 2007/0134888 A1 Jun. 14, 2007

(51) Int. Cl.
*H01L 29/76* (2006.01)
(52) U.S. Cl. ............... 257/314; 257/202; 257/E29.309; 257/E21.18; 257/E21.423; 438/201; 438/211; 438/257; 438/593
(58) Field of Classification Search ............... 257/202, 257/298, 314, E21.579, E29.309, E21.18, 257/E21.423; 438/201, 211, 257, 593, 637, 438/638
See application file for complete search history.

(56) References Cited

U.S. PATENT DOCUMENTS

| | | | |
|---|---|---|---|
| 3,609,477 A * | 9/1971 | Drangeid et al. ............ | 257/284 |
| 4,894,693 A | 1/1990 | Tigelaar et al. | |
| 5,273,921 A | 12/1993 | Neudeck et al. | |
| 5,773,331 A | 6/1998 | Solomon et al. | |
| 5,929,479 A | 7/1999 | Oyama | |
| 6,064,589 A | 5/2000 | Walker | |
| 6,284,578 B1 | 9/2001 | Ni | |
| 6,339,002 B1 | 1/2002 | Chan et al. | |
| 6,365,465 B1 | 4/2002 | Chan et al. | |
| 6,580,132 B1 | 6/2003 | Chan et al. | |
| 6,624,032 B2 | 9/2003 | Alavi et al. | |
| 6,642,115 B1 | 11/2003 | Cohen et al. | |

(Continued)

OTHER PUBLICATIONS

Lee et al; "Novel Body Tied FinFET Cell Array Transistor DRAM with negative Word Line Operation for sub 60nm Technology and Beyond"; 2004 Symposium on VLSI Technology Digest of Papers; IEEE pp. 130-131.

(Continued)

*Primary Examiner*—Michelle Estrada
(74) *Attorney, Agent, or Firm*—Joanna G. Chiu; James L. Clingan, Jr.

(57) ABSTRACT

A method of making a semiconductor device includes providing a first wafer and providing a second wafer having a first side and a second side, the second wafer including a semiconductor substrate, a storage layer, and a layer of gate material. The storage layer may be located between the semiconductor structure and the layer of the gate material and the storage layer may be located closer to the first side of the second wafer than the semiconductor structure. The method further includes boding the first side of the second wafer to the first wafer. The method further includes removing a first portion of the semiconductor structure to leave a layer of the semiconductor structure after the bonding. The method further includes forming a transistor having a channel region, wherein at least a portion of the channel region is formed from the layer of the semiconductor structure.

14 Claims, 6 Drawing Sheets

U.S. PATENT DOCUMENTS

| | | |
|---|---|---|
| 6,646,307 B1 | 11/2003 | Yu et al. |
| 6,657,263 B2 | 12/2003 | Ni |
| 6,762,101 B2 | 7/2004 | Chan et al. |
| 6,855,982 B1 | 2/2005 | Xiang et al. |
| 6,888,195 B2 | 5/2005 | Saito et al. |
| 6,909,139 B2 | 6/2005 | Shum et al. |
| 6,919,647 B2 | 7/2005 | Hackler, Sr. et al. |
| 6,943,084 B2 | 9/2005 | Lee et al. |
| 6,946,696 B2 | 9/2005 | Chan et al. |
| 6,982,460 B1 | 1/2006 | Cohen et al. |
| 7,018,873 B2 | 3/2006 | Dennard et al. |
| 7,074,623 B2 | 7/2006 | Lochtefeld et al. |
| 7,132,751 B2 * | 11/2006 | Chang ........................ 257/758 |
| 7,244,976 B2 * | 7/2007 | Cai et al. .................... 257/208 |
| 7,276,760 B2 * | 10/2007 | Bhattacharyya ............. 257/321 |
| 7,315,055 B2 * | 1/2008 | Cho et al. ................... 257/314 |
| 7,402,850 B2 * | 7/2008 | Bhattacharyya ............. 257/239 |
| 2002/0140032 A1 | 10/2002 | Cho et al. |
| 2004/0046207 A1 | 3/2004 | Dennard et al. |
| 2004/0108537 A1 | 6/2004 | Tiwari |
| 2004/0124917 A1 | 7/2004 | Takagi |
| 2004/0262669 A1 | 12/2004 | Shum et al. |
| 2005/0023460 A1 | 2/2005 | Brown et al. |
| 2005/0101072 A1 | 5/2005 | Bryant et al. |
| 2005/0127412 A1 | 6/2005 | Cohen et al. |
| 2005/0151206 A1 | 7/2005 | Schwerin |
| 2005/0180215 A1 | 8/2005 | Shum et al. |

OTHER PUBLICATIONS

Park et al; "Fabrication of Body-Tied FinFETs (Omega MOSFETSs) Using Bulk Si Wafers"; 2003 Symposium on VLSI Technology Digest of Papers.

Dao, Thuy et al. "Advanced Double-Gate Fully-Depleted Silicon-on-Insulator (DG-FDSOI) Device and Device Impact on Circuit Design & Power Management"; 2004 IEEE International Conference on Integrated Circuit Design and Technology; May 17-20, 2004; pp. 99-103; IEEE.

Jones, Eric C. et al.; "High Performance of Planar Double Gate MOSFETs with Thin Backgate Dielectrics"; 2001 Device Research Conference; 2001; pp. 28-29; NY.

Maleville, C. et al.; Multiple SOI layers by multiple Smart-Cut transfers; 2000 IEEE International SOI Conference; Oct. 2000; pp. 134-135; IEEE.

Solomon, P.M. et al.; "Two Gates are Better Than One"; IEEE Circuits & Devices Magazine; Jan. 2003; pp. 48-62, IEEE.

Wong, Hon-Sum Philip et al.; "Device Design Considerations for Double-Gate, Ground-Plane, and Single-Gated Ultra-Thin SOI MOSFET's at the 25 nm Channnel Length Generation"; IEDM; 1998; pp. 15.2.1-15.2.4, IEEE.

PCT/US06/606396 International Search Report and Written Opinion.

* cited by examiner

BACK-GATED SEMICONDUCTOR DEVICE WITH A STORAGE LAYER AND METHODS FOR FORMING THEREOF

RELATED APPLICATION

A related, copending application is entitled "Method of Forming a Transistor with a Bottom Gate," by Thuy Dao, application Ser. No. 10/871,402, assigned to Freescale Semiconductor, Inc., and was filed on Jun. 18, 2004.

BACKGROUND OF THE INVENTION

1. Field of the Invention

This invention relates in general to semiconductor devices and more specifically to a back-gated semiconductor device with a storage layer and methods for forming thereof.

2. Description of the Related Art

Traditional single gate and double gate Fully Depleted Semiconductor-on-Insulator (FDSOI) transistors have advantages related to reduced short channel effects and reduced un-wanted parasitic capacitances. However, when used as a non-volatile memory these transistors require programming, such as hot carrier injection (HCI) programming. HCI programming results in generation of holes because of impact ionization. Because of the floating nature of the body in such FDSOI devices, however, holes generated due to impact ionization may accumulate in the body of such FDSOI devices. Accumulated holes may then generate enough potential to cause problems, such as snap-back of the FDSOI devices.

Thus, there is a need for improved FDSOI transistors and methods of forming thereof.

BRIEF DESCRIPTION OF THE DRAWINGS

The present invention may be better understood, and its numerous objects, features, and advantages made apparent to those skilled in the art by referencing the accompanying drawings.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

The following sets forth a detailed description of a mode for carrying out the invention. The description is intended to be illustrative of the invention and should not be taken to be limiting.

A back-gated non-volatile memory (NVM) device with its channel available for contacting to overcome the typical problem of charge accumulation associated with NVMs in semiconductor on insulator (SOI) substrates is provided. A substrate supports the gate. A storage layer is formed on the gate, which may be nanocrystals encapsulated in an insulating layer, but could be of another type such as nitride. A channel is formed on the storage layer. A conductive region, which can be conveniently contacted, is formed on the channel. This results in an escape path for minority carriers that are generated during programming, thereby avoiding charge accumulation in or near the channel. This is achievable with a method that includes bonding two wafers, cleaving away most of one of the wafers, forming the conductive region after the cleaving, and epitaxially growing the source/drains laterally from the channel while the conductive region is isolated from this growth with a sidewall spacer.

Figure 1:
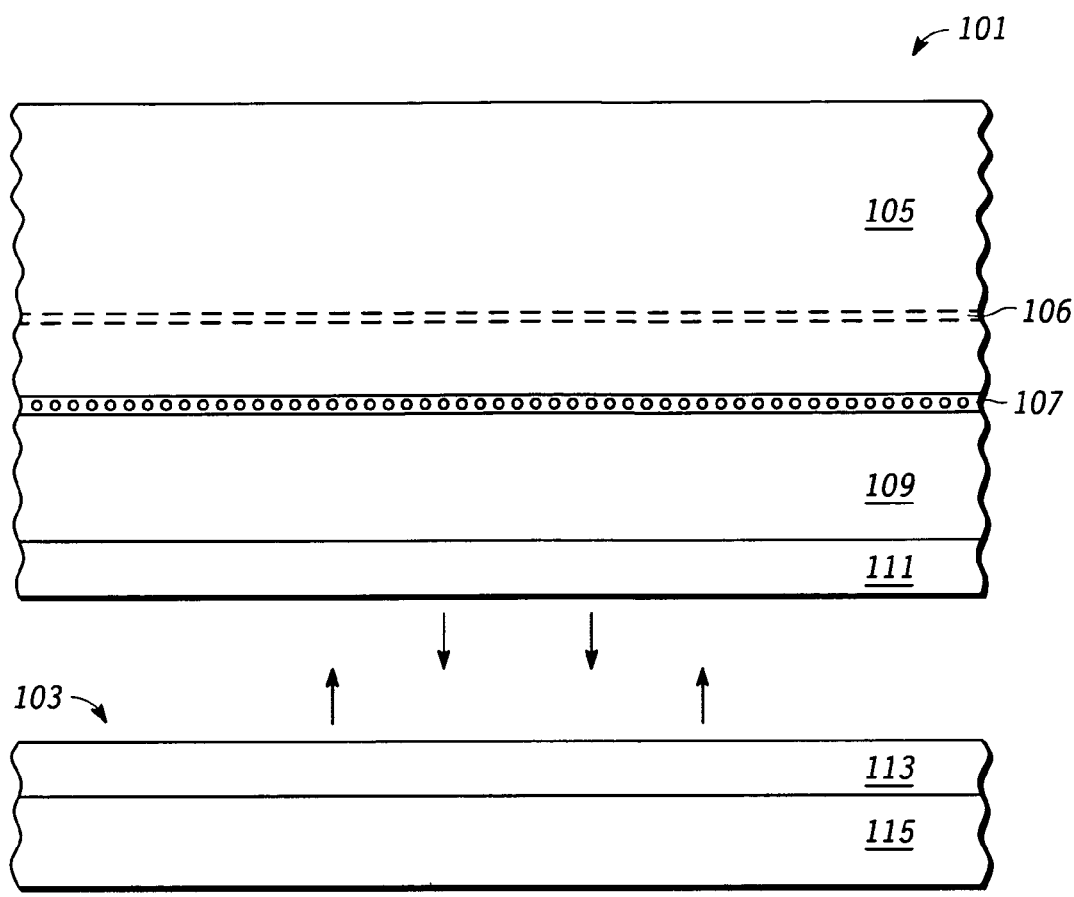
FIG. 1 is a side view of one embodiment of two wafers being bonded together to form a resultant wafer, consistent with one embodiment of the invention.

FIG. 1 shows a side view of two wafers 101 and 103 that are to be bonded together to form a resultant wafer (201 of FIG. 2), from which non-volatile memory cells may be formed, for example. Wafer 101 includes a layer 109 of gate material, a storage layer 107, and semiconductor substrate 105. By way of example, substrate 105 is made of monocrystaline silicon, but in other embodiments, may be made of other types of semiconductor materials such as silicon carbon, silicon germanium, germanium, type III-V semiconductor materials, type II-VI semiconductor materials, and combinations thereof including multiple layers of different semiconductor materials. In some embodiments, semiconductor material of substrate 105 may be strained. Storage layer 107 may be a thin film storage layer or stack and may be made of any suitable material, such as nitrides or nanocrystals. Nanocrystals, such as metal nanocrystals, semiconductor (e.g., silicon, germanium, gallium arsenide) nanocrystals, or a combination thereof may be used. Storage layer 107 may be formed by a chemical vapor deposition process, a sputtering process, or another suitable deposition process.

Referring still to FIG. 1, by way of example, layer 109 includes doped polysilicon, but may be made of other materials such as, amorphous silicon, tungsten, tungsten silicon, germanium, amorphous germanium, titanium, titanium nitride, titanium silicon, titanium silicon nitride, tantalum, tantalum silicon, tantalum silicon nitride, other silicide materials, other metals, or combinations thereof including multiple layers of different conductive materials. An insulator 111 may be formed (e.g., grown or deposited) on layer 109. In one embodiment, insulator 111 includes silicon oxide, but may include other materials such as e.g. PSG, FSG, silicon nitride, and/or other types of dielectric including high thermal, conductive dielectric materials.

Wafer 103 may include a substrate 115 (e.g., silicon) with an insulator 113 formed on it. In one embodiment, the material of insulator 113 is the same as the material of insulator 111. By way of example, wafer 103 includes a metal layer (not shown) at a location in the middle of insulator 113. This metal layer may be utilized for noise reduction in analog devices built from resultant wafer 201.

Wafer 101 is shown inverted so as to be bonded to wafer 103 in the orientation shown in FIG. 1. In one embodiment, insulator 111 is bonded to insulator 113 with a bonding material. In other embodiments, wafer 101 may be bonded to wafer 103 using other bonding techniques. For example, in one embodiment, wafer 101 may be bonded to wafer 103 by electrostatic bonding followed by thermal bonding or pressure bonding.

In some embodiments, wafer 101 does not include insulator 111 where layer 109 is bonded to insulator 113. In other embodiments, wafer 103 does not include insulator 113 where insulator 111 is bonded to substrate 115.

Wafer 101 may include a stress layer 106 formed by implanting a dopant (e.g. H+) into substrate 105. In some embodiments, the dopant is implanted prior to the formation of storage layer 107, but in other embodiments, may be implanted at other times including after the formation of storage layer 107 and prior to the formation of layer 109, after the formation of layer 109 and prior to the formation of insulator 111, or after the formation of insulator 111. In other embodiments, the dopant for forming stress layer 106 may be implanted after wafer 103 has been bonded to wafer 101.

Figure 2:
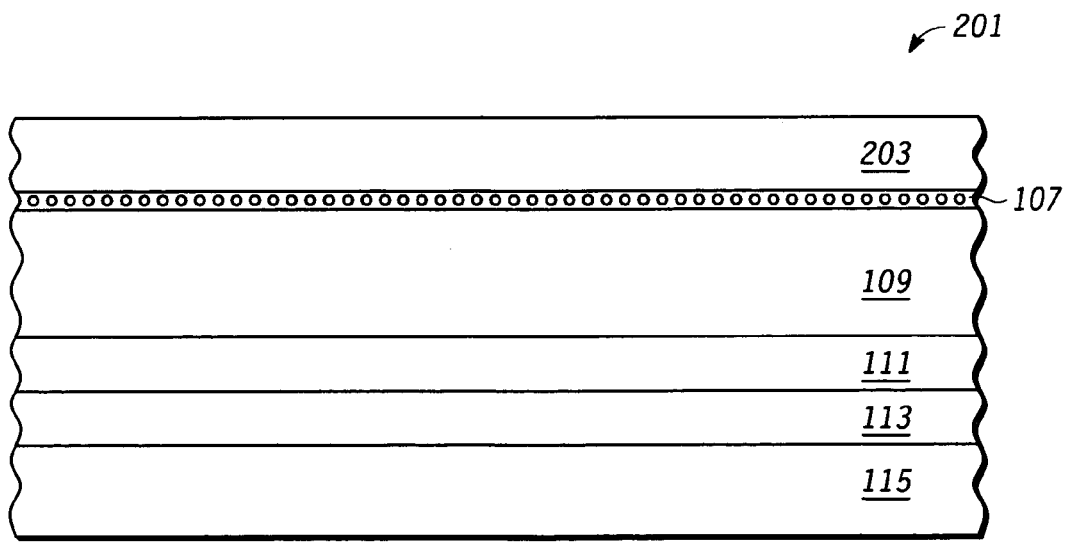
FIG. 2 shows a side view of one embodiment of a bonded wafer, consistent with one embodiment of the invention.

FIG. 2 shows a side view of resultant wafer 201 after wafer 103 and 101 have been bonded together. The view in FIG. 2 also shows wafer 201 after a top portion of substrate 105 has been removed, e.g., by cleaving. By way of example, cleaving is performed by dividing substrate 105 at stress layer 106. Layer 203 is the remaining portion of substrate 105 after the cleaving. One advantage of forming the layer by cleaving is that it may allow for a channel region to be formed from a relatively pure and crystalline structure as opposed to a semiconductor layer that is grown or deposited on a dielectric.

Figure 3:
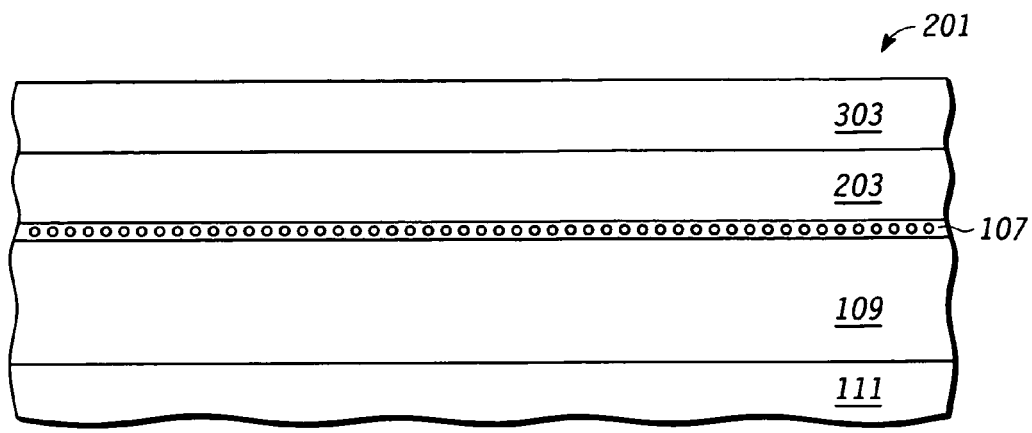
FIG. 3 shows a partial cross-sectional side view of one embodiment of a wafer during a stage in its manufacture, consistent with one embodiment of the invention.
Figure 4:
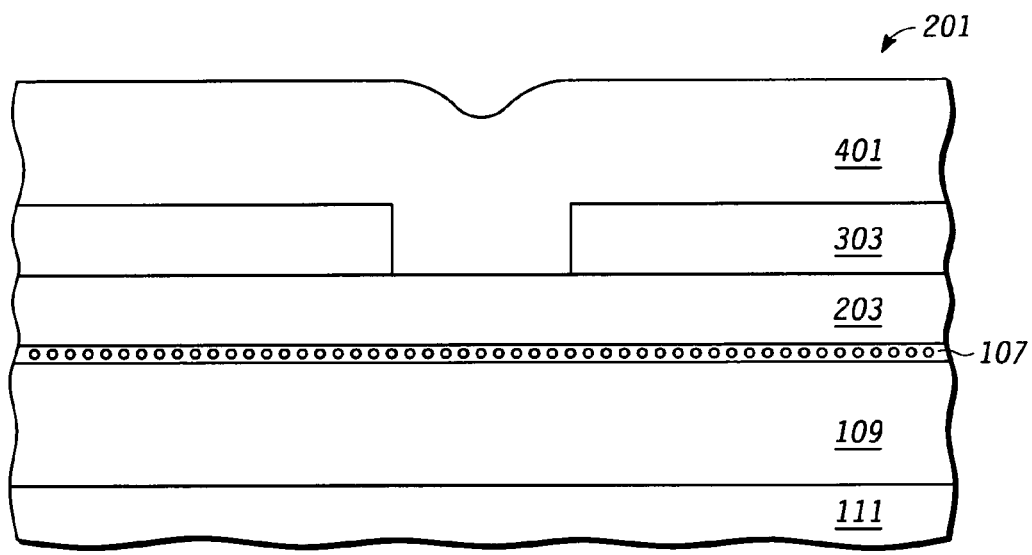
FIG. 4 shows a partial cross-sectional side view of one embodiment of a wafer during another stage in its manufacture, consistent with one embodiment of the invention.

FIG. 3 shows a partial side cross-sectional view of wafer 201. Not shown in the view of FIG. 3 (or in subsequent Figures) are insulator 113 and substrate 115. After substrate 105 is cleaved to form layer 203, an oxide layer 303 is formed over layer 203. Layer 303 may be thicker than layer 203. Next, as shown in FIG. 4, a layer of polysilicon, to form conductive region 401, may be deposited over oxide layer 303 after a middle portion of oxide layer 303 is patterned and then etched away. Thus, polysilicon layer is deposited directly on the transistor channel. The polysilicon layer may be doped in-situ or doped by implantation. Appropriate doping materials may be used depending on the type of device being manufactured. Conductive region 401 may be used as a well contact. If necessary, an appropriate pre-clean may be performed to remove any interfacial oxide layer. Conductive region 401 may remove minority carriers, such as holes from the channel region 203 of a transistor formed from wafer 201.

Figure 5:
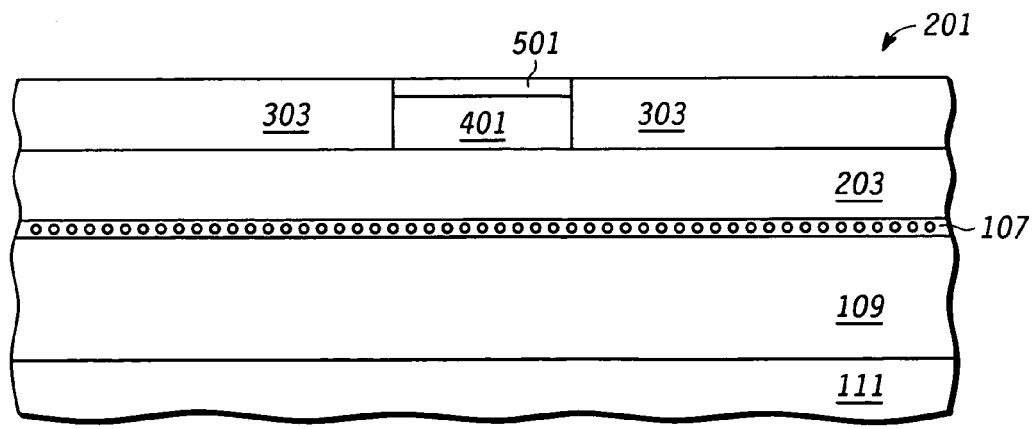
FIG. 5 shows a partial cross-sectional side view of one embodiment of a wafer during another stage in its manufacture, consistent with one embodiment of the invention.
Figure 6:
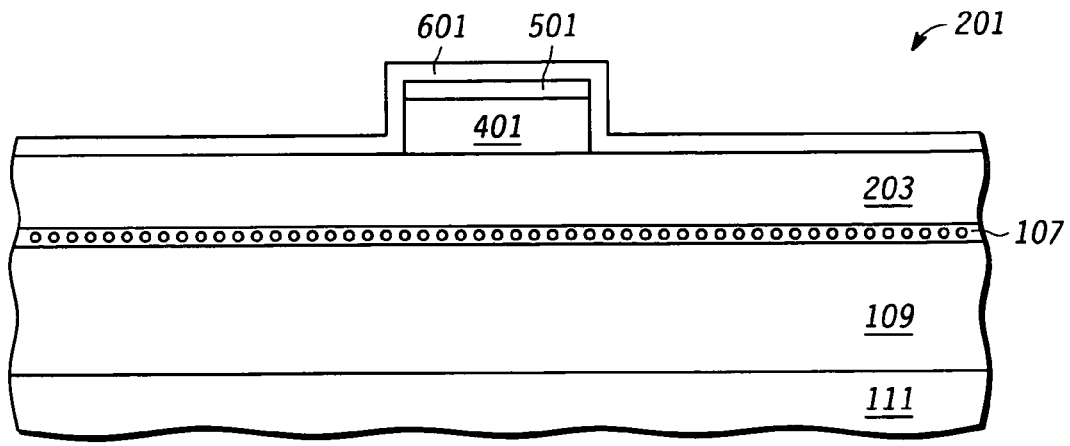
FIG. 6 shows a partial cross-sectional side view of one embodiment of a wafer during another stage in its manufacture, consistent with one embodiment of the invention.

Next, as shown in FIG. 5, polysilicon layer forming conductive region 401 may be planarized by chemical-mechanical polishing, for example. Furthermore, a portion from top part of polysilicon layer forming conductive region 401 may be etched and a nitride cap 501 may be formed on top of conductive region 401. In one embodiment, nitride cap 501 should be at least as thick as layer 203 so that nitride cap 501 may serve as an implant mask during implantation described with respect to FIG. 7. This would ensure the doping of layer 401 is unaltered during implantation. Referring now to FIG. 6, a liner 601, such as an oxide liner may be formed after oxide layer 303 is removed.

Figure 7:
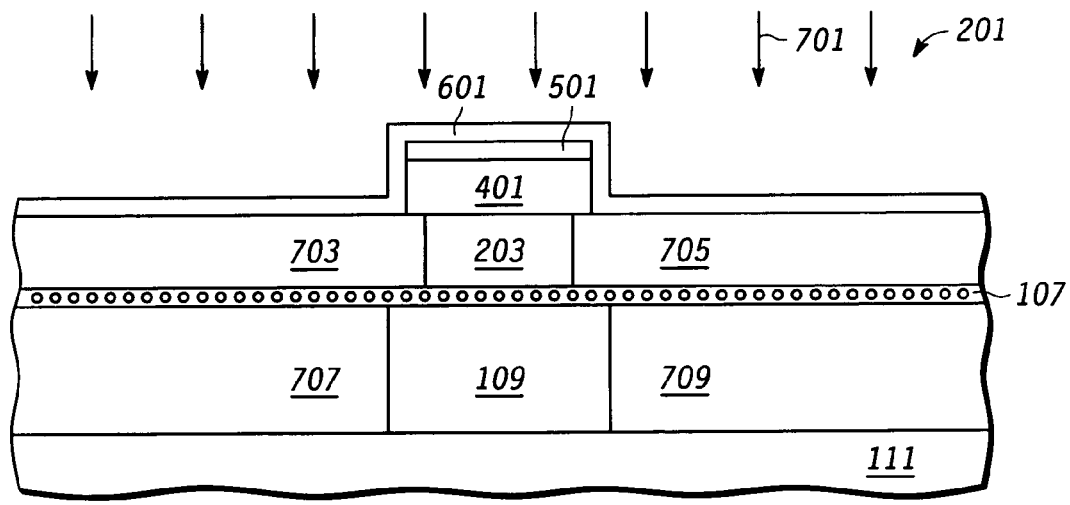
FIG. 7 shows a partial cross-sectional side view of one embodiment of a wafer during another stage in its manufacture, consistent with one embodiment of the invention.
Figure 8:
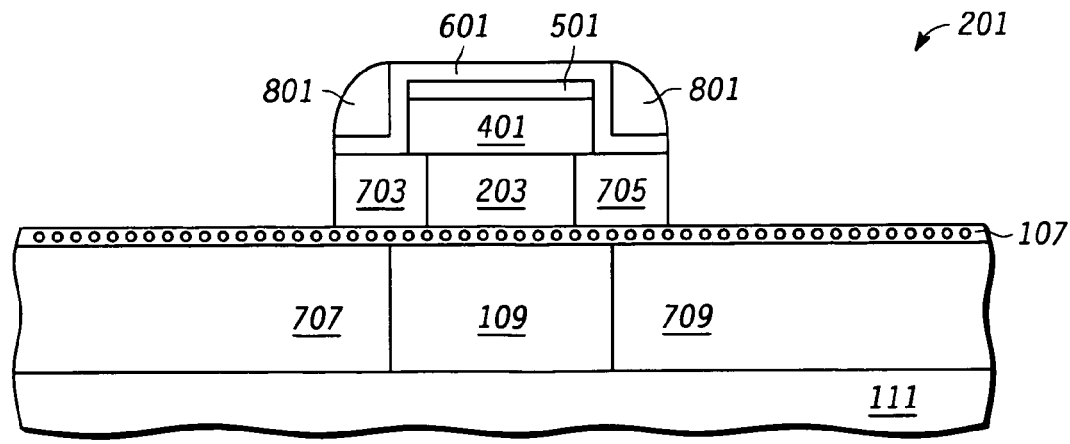
FIG. 8 shows a partial cross-sectional side view of one embodiment of a wafer during another stage in its manufacture, consistent with one embodiment of the invention.

Next, as shown in FIG. 7, two implants 701 may be performed. First, amorphization implants may be performed in portions 707/709. By way of example, germanium may be used to perform amorphization implants. Second, source/drain implants may be performed in portions 703/705 to form source/drain extensions. Appropriate n-type or p-type dopants may be used as part of this step. The region (203) under conductive region 401 may serve as a channel region. Referring now to FIG. 8, a spacer 801 may be formed on the sidewalls of conductive region 401 (lined by liner 601). Spacer 801 may be made of multiple layers of dielectric materials. Spacer 801 may protect certain portions of portions 703/705 during subsequent processing. Next, exposed portions of portions 703/705 may be etched away.

Figure 9:
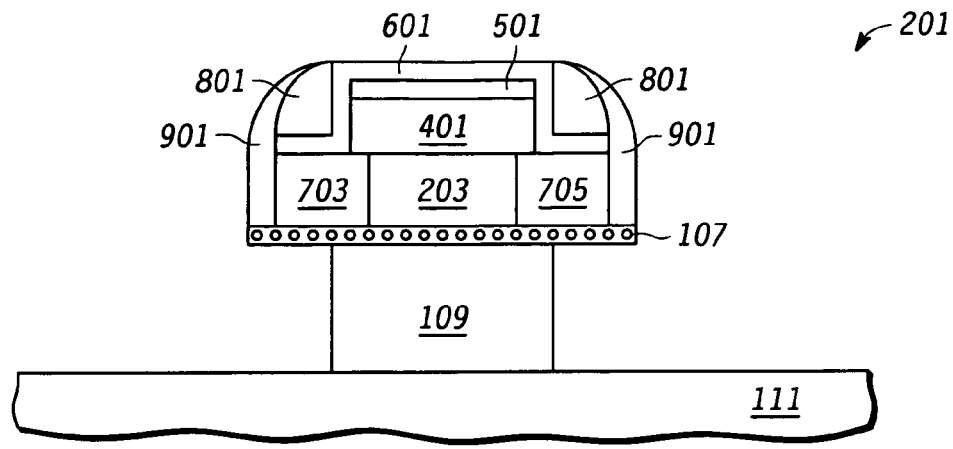
FIG. 9 shows a partial cross-sectional side view of one embodiment of a wafer during another stage in its manufacture, consistent with one embodiment of the invention.
Figure 10:
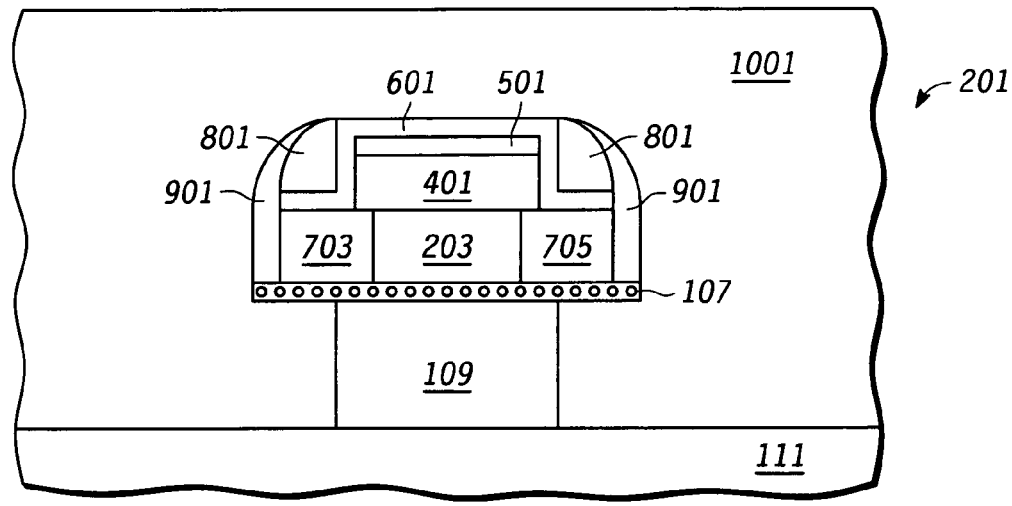
FIG. 10 shows a partial cross-sectional side view of one embodiment of a wafer during another stage in its manufacture, consistent with one embodiment of the invention.
Figure 11:
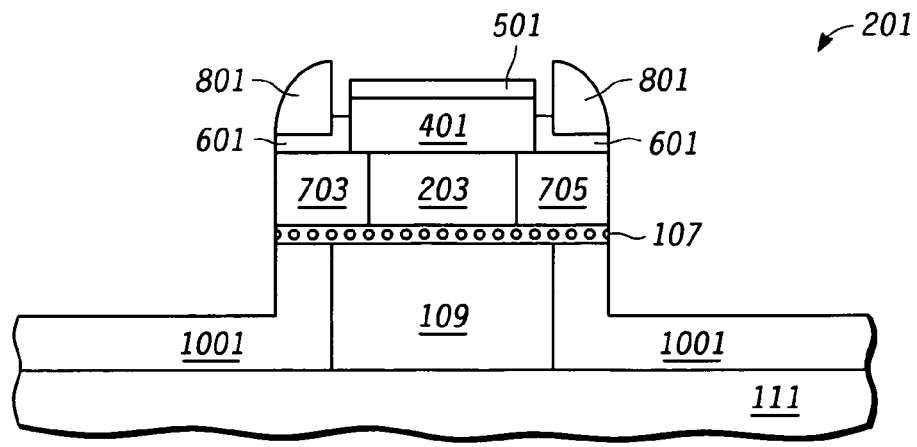
FIG. 11 shows a partial cross-sectional side view of one embodiment of a wafer during another stage in its manufacture, consistent with one embodiment of the invention.
Figure 12:
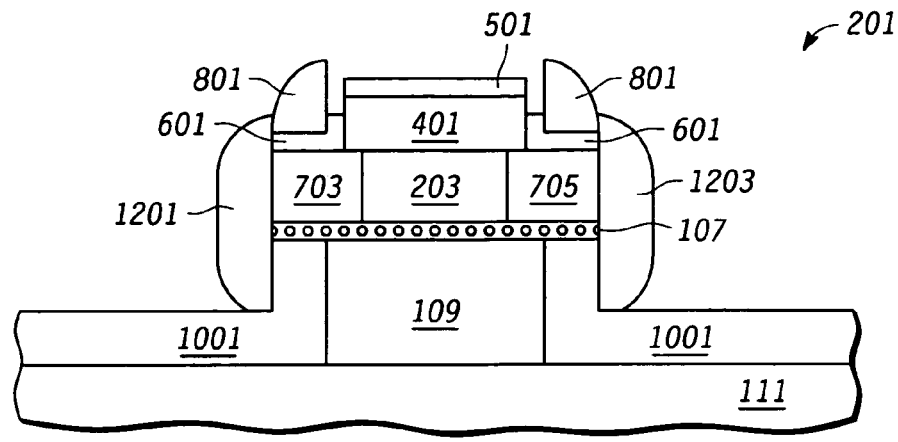
FIG. 12 shows a partial cross-sectional side view of one embodiment of a wafer during another stage in its manufacture, consistent with one embodiment of the invention.

Next, as shown in FIG. 9, a second spacer 901 may be formed to protect sidewalls of portions 703/705. Furthermore, portions 707/709 implanted with amorphization implants may be etched away. Referring now to FIG. 10, an oxide layer 1001 may be deposited on wafer 201. Next, as shown in FIG. 11, selected portions of oxide layer 1001 may be etched away. Etching of selected portions of oxide layer 1001 may result in partial etching of liner 601, as well. FIG. 12 shows a partial cross-sectional side view of wafer 201 after structures 1201 and 1203 are epitaxially grown on the exposed sidewalls of channel region (including portion 203).

Figure 13:
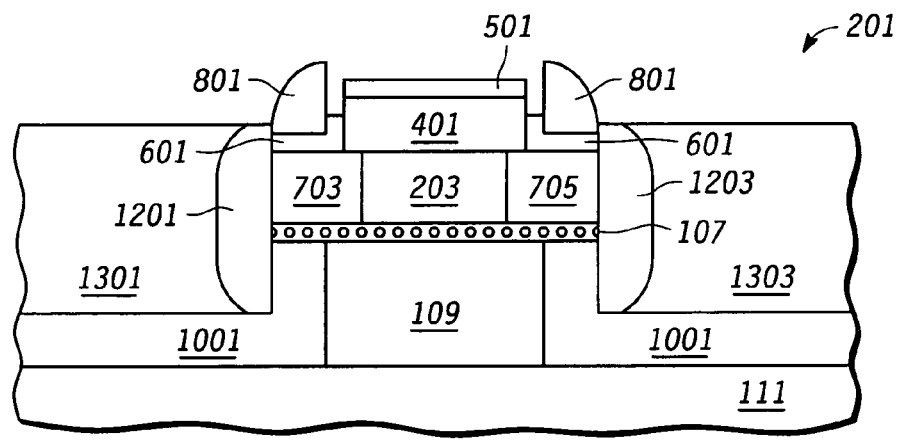
FIG. 13 shows a partial cross-sectional side view of one embodiment of a wafer during another stage in its manufacture, consistent with one embodiment of the invention.
Figure 14:
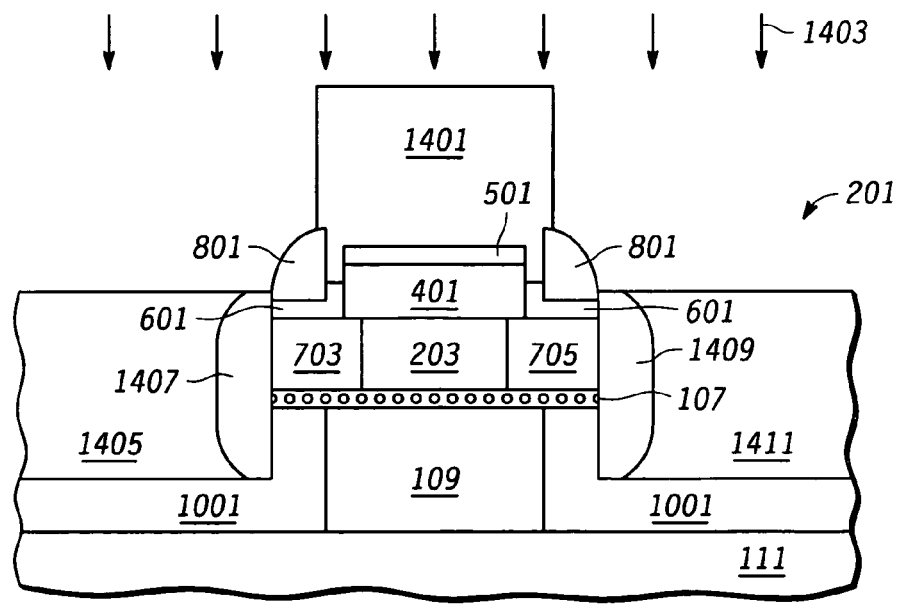
FIG. 14 shows a partial cross-sectional side view of one embodiment of a wafer during another stage in its manufacture, consistent with one embodiment of the invention.
Figure 15:
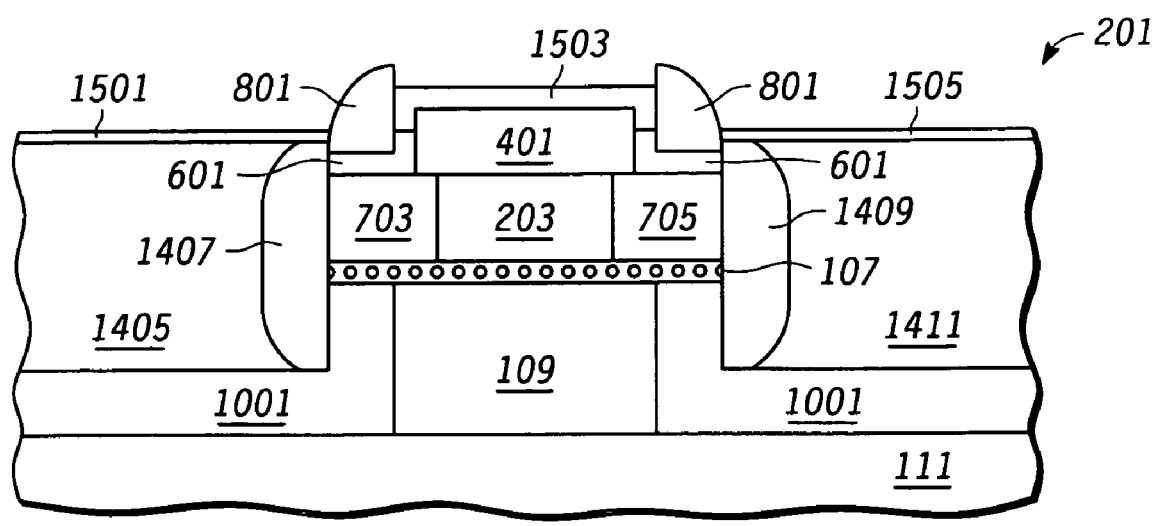
FIG. 15 shows a partial cross-sectional side view of one embodiment of a wafer during another stage in its manufacture, consistent with one embodiment of the invention.

Referring to FIG. 13 now, an amorphous silicon layer 1301/1303 may be deposited. Amorphous silicon layer 1301/1303 may be subjected to chemical mechanical polishing and etched back. Next, as shown in FIG. 14, a photoresist layer 1401 may be formed on top of a selected portion of wafer 201 and source/drain implants 1403 may be made forming doped source/drain regions 1405 and 1411. Next, as shown in FIG. 15, silicides 1501, 1503, and 1505 may be formed after nitride cap 501 is stripped. Gate silicide 1503 may be formed on top of conductive region 401. By way of example, silicides may be formed using a silicide implantation (e.g., cobalt or nickel) followed by a heat treatment. Alternatively, silicides may be formed by depositing a layer of metal over the wafer and reacting the metal with the underlying material.

By way of example, the semiconductor device formed on wafer 201 may be used as a non-volatile memory. The non-volatile memory may include cells formed of the semiconductor device, which may be programmed using techniques such as, hot carrier injection. For example, using HCI, one bit per cell may be stored in storage layer 107 by applying a positive bias voltage to gate 109, applying a positive voltage to drain region 1411, grounding source region 1405, and applying a negative voltage to conductive region 401 or grounding conductive region 401. HCI programming may result in generation of minority carriers, such as holes because of impact ionization. Conductive region 401 may provide an escape path for holes thereby preventing accumulation of holes in channel region 203.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A semiconductor device structure, comprising:
   a substrate;
   a gate over the substrate;
   a storage layer over the gate;
   a channel region over the storage layer;
   source/drain regions laterally adjacent to the channel; and
   a conductive region over and in direct contact with the channel region and overlapping the channel region.

2. The semiconductor device of claim 1, wherein the storage layer comprises nanocrystals.

3. The semiconductor device of claim 1 further comprising a sidewall spacer laterally adjacent to the conductive region.

4. The semiconductor device of claim 1, wherein the conductive region comprises means for a well contact.

5. The semiconductor device of claim 1, wherein the conductive region comprises polysilicon and the channel region comprises monocrystalline silicon.

6. The semiconductor device of claim 1 further comprising silicide layers on the gate and the source/drains.

7. The semiconductor device of claim 1, wherein the source/drain regions comprise monocrystalline regions adjacent to the channel and polysilicon regions adjacent to the monocrystalline regions.

8. A non-volatile memory cell, comprising:
   a substrate;
   a control gate on the substrate;
   a storage layer on the control gate;
   a monocrystalline channel region on the storage layer; and
   a conductive region extending upward from the channel region for removing minority carriers from the channel.

9. The non-volatile memory cell of claim 8, wherein the conductive region is further characterized as being polycrystalline.

10. The non-volatile memory cell of claim 8, wherein the control gate comprises polysilicon.

11. The non-volatile memory cell of claim 8, wherein the storage layer comprises nanocrystals.

12. The non-volatile memory cell of claim 8 further comprising:
    a drain on a first side of the channel; and
    a source on a second side of the channel, wherein the source and drain are monocrystalline adjacent to the channel.

13. The non-volatile memory of claim 8, further comprising a first silicide layer on a portion of the source, a second silicide layer on a portion of the drain, and a third silicide layer on a portion of the conductive region.

14. The non-volatile memory cell of claim 8 further comprising a sidewall spacer adjacent to a side of the conductive region.

* * * * *